(12) United States Patent
Kim et al.

(10) Patent No.: US 7,371,603 B2
(45) Date of Patent: May 13, 2008

(54) METHOD OF FABRICATING LIGHT EMITTING DIODE PACKAGE

(75) Inventors: Yong Suk Kim, Suwon (KR); Seog Moon Choi, Seoul (KR); Hyoung Ho Kim, Suwon (KR); Yong Sik Kim, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 169 days.

(21) Appl. No.: 11/439,189

(22) Filed: May 24, 2006

(65) Prior Publication Data

US 2006/0270078 A1    Nov. 30, 2006

(30) Foreign Application Priority Data

May 26, 2005  (KR) ...................... 10-2005-0044519

(51) Int. Cl.
*H01L 21/00* (2006.01)
*H01L 21/50* (2006.01)
*H01L 21/48* (2006.01)
*H01L 21/44* (2006.01)

(52) U.S. Cl. ................. 438/64; 438/115; 438/57; 438/69; 438/71; 438/125; 438/127; 438/974

(58) Field of Classification Search .................. 438/64, 438/115, 57, 69, 71, 125, 127, 974
See application file for complete search history.

(56) References Cited

U.S. PATENT DOCUMENTS

| | | | |
|---|---|---|---|
| 6,610,563 B1 * | 8/2003 | Waitl et al. ................. | 438/166 |
| 6,953,952 B2 * | 10/2005 | Asakawa ..................... | 257/103 |
| 7,045,905 B2 * | 5/2006 | Nakashima ................. | 257/787 |

FOREIGN PATENT DOCUMENTS

JP    2002-151747 A    5/2002

* cited by examiner

*Primary Examiner*—Luan Thai
(74) *Attorney, Agent, or Firm*—McDermott Will & Emery LLP

(57) ABSTRACT

The invention relates to an LED package and proposes a method of fabricating an LED package including steps of providing a package substrate having a mounting area of an LED and a metal pattern to be connected with the LED, and plasma-treating the package substrate to reform at least a predetermined surface area of the package substrate where a resin-molded part will be formed. The method also includes mounting the LED on the mounting area on the substrate package and electrically connecting the LED with the metal pattern, and forming the resin-molded part in the mounting area of the LED to seal the LED package.

9 Claims, 5 Drawing Sheets

(a)

plasma treatment (b)

plasma treatment

METHOD OF FABRICATING LIGHT EMITTING DIODE PACKAGE

CLAIM OF PRIORITY

This application claims the benefit of Korean Patent Application No. 2005-44519 filed on May 26, 2005, in the Korean Intellectual Property Office, the disclosure of which is incorporated herein by reference.

BACKGROUND OF THE INVENTION

1. Field of the Invention

The present invention relates to a light emitting diode (LED) package, and more particularly, a method of fabricating an LED package having enhanced adhesion strength between a resin-molded part and a package substrate.

2. Description of the Related Art

In general, a light emitting diode (LED) is adopted extensively, ranging from small electronic devices like mobile communication terminals to large-sized displays like traffic lights and automobile lamps. Such an LED requires a package that ensures high luminance while providing good protection against heat and is durable in all kinds of external environment.

In general, an LED package has a structure with an LED chip therein, sealed by a resin-molded part, which however is heterogeneous from a substrate such as made of silicon, and thus the interface therebetween is weak in adhesion strength, and they may easily be separated. FIG. 1 is a cross-sectional view illustrating a conventional white LED package.

Referring to FIG. 1, the LED package 10 includes a lower substrate 11 and an upper substrate 12 having a cavity formed therein. The lower substrate 11 has adequate metal patterns such as lead frames 14a and 14b, conductive vias 15a and 15b, and bonding pads 16a and 16b. An LED 18 is mounted in a mounting area defined by a cavity and can be electrically connected to the lead frames 14a and 14b via connecting means like wires. A resin-molded part 19 is formed in the mounting area with the LED 18 mounted therein. The resin-molded part 19 typically has functions of protecting the LED 18, and with a specific phosphor contained therein, of converting a wavelength.

In general, the resin-molded part 19 is mainly composed of silicone, epoxy, urethane resin or a compound thereof, whereas the package substrate can adopt different material such as silicone having high heat conductivity and good machinability. In this respect, the resin-molded part 19 and the package substrate 11 and 12 can be bonded inadequately at interface A. This inadequate adhesion may allow penetration of moisture, degrading the reliability of the device, and further can result in fatal defects such as the resin-molded part 19 being separated under the suddenly changing temperature.

Therefore, there have been required a new technology in the field which can improve adhesion strength between the resin-molded part and the package substrate in an LED package.

SUMMARY OF THE INVENTION

The present invention has been made to solve the foregoing problems of the prior art and it is therefore an object of the present invention to provide a new method of fabricating a light emitting diode (LED) package in which the surface of a package substrate is reformed to firmly bond a resin-molded part and the package substrate at an interface therebetween.

According to an aspect of the invention for realizing the object, there is provided a method of fabricating a light emitting diode (LED) package including steps of: providing a package substrate having a mounting area of an LED and a metal pattern to be connected with the LED; plasma-treating the package substrate to reform at least a predetermined surface area of the package substrate where a resin-molded part will be formed; mounting the LED on the mounting area on the substrate package and electrically connecting the LED with the metal pattern; and forming the resin-molded part in the mounting area of the LED to seal the LED package.

In a particular embodiment of the present invention, the package substrate may include an upper substrate having a cavity with a sloped side wall, formed in an area corresponding to the mounting area of the LED, and a lower substrate having the mounting area of the LED and the metal pattern on an upper surface thereof.

Preferably, the step of plasma-treating is performed on the entire upper and lower substrates, respectively, for the sake of convenience in the process. The step of plasma-treating is performed at wafer level before the package substrate is cut into individual packages.

The package substrate may be a silicon substrate, in which case, the step of plasma-treating is performed in a vacuum state with inert gas as a reactive gas at an output power of 700 W to 1500 W for 1 to 3 hours. Under such plasma treatment conditions, it is preferable that a silicon substrate is kept at a temperature ranging from 80° C. to 120° C.

The resin-molded part may be made of epoxy resin, silicone resin, urethane resin or a compound thereof.

In another embodiment of the present invention, heat treatment can be performed instead to obtain reforming effect similar to that of the plasma treatment. This method includes steps of: providing a silicon package substrate having a mounting area of an LED and a metal pattern to be connected with the LED; heat-treating the package substrate in an atmosphere of inert gas at a temperature ranging from about 300° C. to 400° C. for 1 to 3 hours in order to reform at least a predetermined surface area of the package substrate where a resin-molded part will be formed; mounting the LED on the mounting area of the LED and electrically connecting the LED with the metal pattern; and forming the resin-molded part in the mounting area of the LED to seal the LED package.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 2:
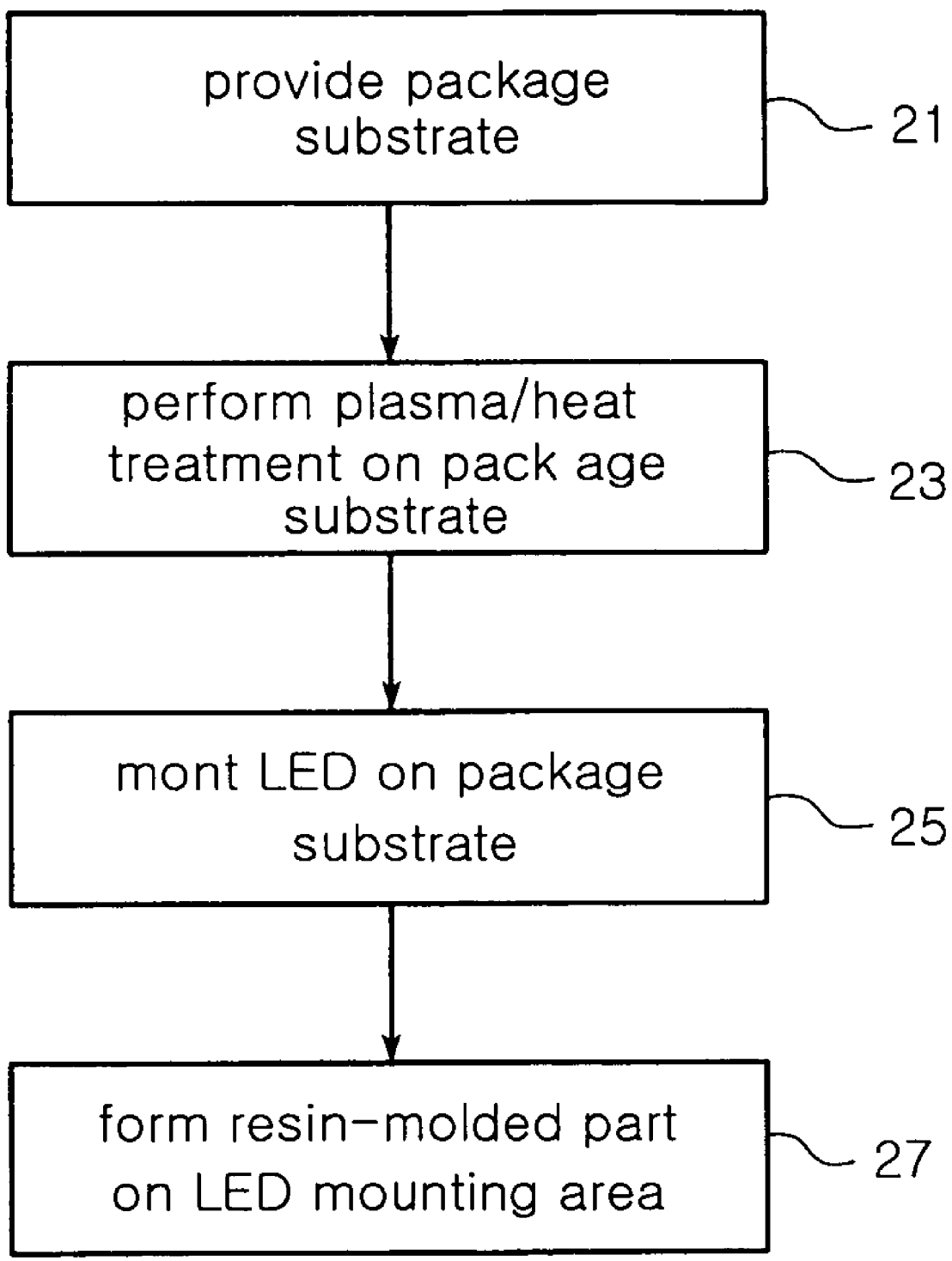
FIG. 2 is a flow chart illustrating a process for fabricating an LED package according to the present invention.

FIG. 2 illustrates a process of fabricating a light emitting diode (LED) package according to the present invention.

As shown in FIG. 2, the method of fabricating the LED package according to the present invention starts with a step 21 of preparing a package substrate. The package substrate can be a silicon substrate having relatively good heat radiation property and machinability. The package substrate for each individual package has a mounting area of an LED and metal patterns to be electrically connected with the LED. The mounting area is defined by a cavity having a side surface faced upward and coated with a reflective film thereon. The metal patterns can take forms of lead frames formed on the mounting area, conductive pads formed on an undersurface of the substrate and conductive vias electrically connecting the frames and the conductive pads. The fabrication process of such a package substrate typically is performed at wafer level.

In the next step 23, plasma or heat treatment is performed on the package substrate to reform the surface of the package substrate. This surface-reforming procedure is conducted on at least a predetermined surface area on the package substrate where a resin-molded part will be formed later, and can be selectively conducted on needed areas of the substrate, but can also be performed on the entire package substrate. As the results from experiments by the inventor of this invention indicate, both heat treatment and plasma treatment yield significant effects in improving adhesion characteristics, and particularly, it was confirmed that plasma treatment yields more preferable effect than the heat treatment. The specific conditions regarding the results will be described later.

In the following step 25, an LED is mounted in the mounting area of the package substrate. The LED mounted can be a chip including additional submount substrate. The LED can be connected to the lead frames formed in advance on the package substrate via connecting means such as a wire.

In the last step 27, the resin-molded part is formed in the mounting area of the LED to seal the LED package. The resin-molded part can be made of epoxy resin, silicone resin, urethane resin, or a compound thereof. In addition, in a white light emitting device, specific phosphors such as YAG or TAG can be added to the resin to form a resin-molded part. The resin-molded part is made of material heterogeneous from that of the substrate, but since the surface of the substrate is reformed by plasma or heat treatment, it can be adhered to the package substrate with high adhesion strength.

Figure 3:
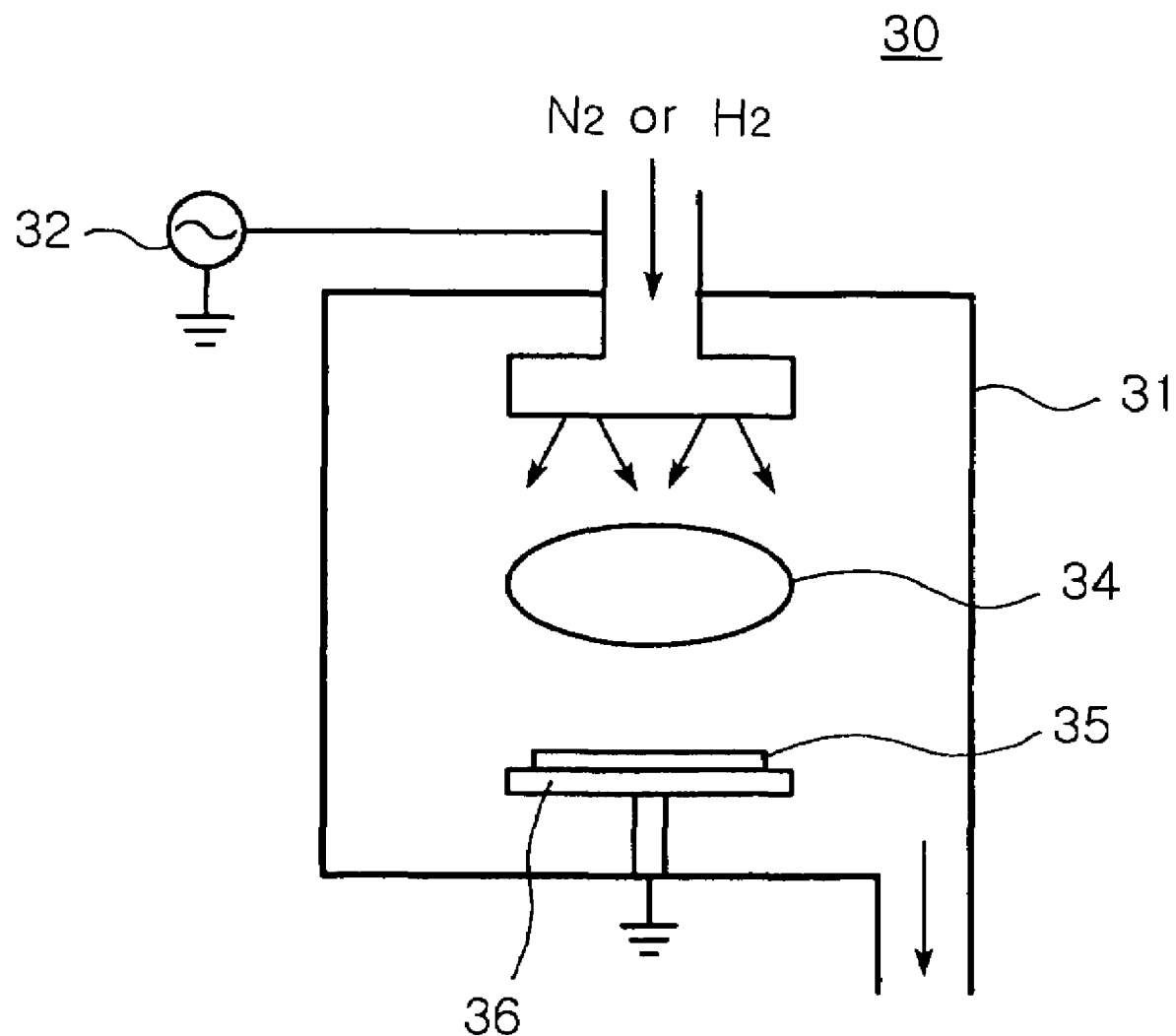
FIG. 3 is a schematic view illustrating a plasma treatment apparatus adopted in the present invention.

FIG. 3 is a diagram illustrating a plasma treatment apparatus used in the present invention.

As shown in FIG. 3, the plasma treatment apparatus 30 according to the present invention includes a reactive chamber 31 for forming plasma. The reactive chamber 31 has a pedestal 36 for supporting the package substrate 35. When high power is applied by a power supplier 32, reactive gas forms glow-discharge plasma 34 in the reactive chamber 31 which is then impinged on the substrate to reform the surface of the substrate. For such reactive gas, it is preferable to use inert gas such as $N_2$ or $H_2$ in order to prevent undesired chemical reaction with the package substrate of for example silicon. The plasma treatment is performed at an appropriate level of supplied power and for an appropriate time so that the substrate surface is reformed to improve adhesion strength without damaging the substrate. The appropriate range is preferably 700 W to 1500 W, and more preferably, 800 W to 1000 W. The time for plasma treatment is preferably 1 to 3 hours. In addition, the effect of plasma can be accelerated when the substrate is heated. Here, the preferable temperature range of the substrate can be 80° C. to 120° C.

The present invention can be applied to various forms of LED packages which require heterogeneous bonding of a resin-molded part with a substrate. Particularly, the package substrate can be a structure in which a predetermined depth of cavity is formed in a single substrate, capable of reflecting. It can also be a structure with an upper substrate with a cavity formed therein stacked on a lower substrate with metal patterns formed thereon as shown in FIGS. 4(a) and 4(b).

FIGS. 4(a) and 4(b) are perspective views illustrating an upper substrate and a lower substrate at wafer level adopted in the LED package according to one embodiment of the invention.

Figure 1:
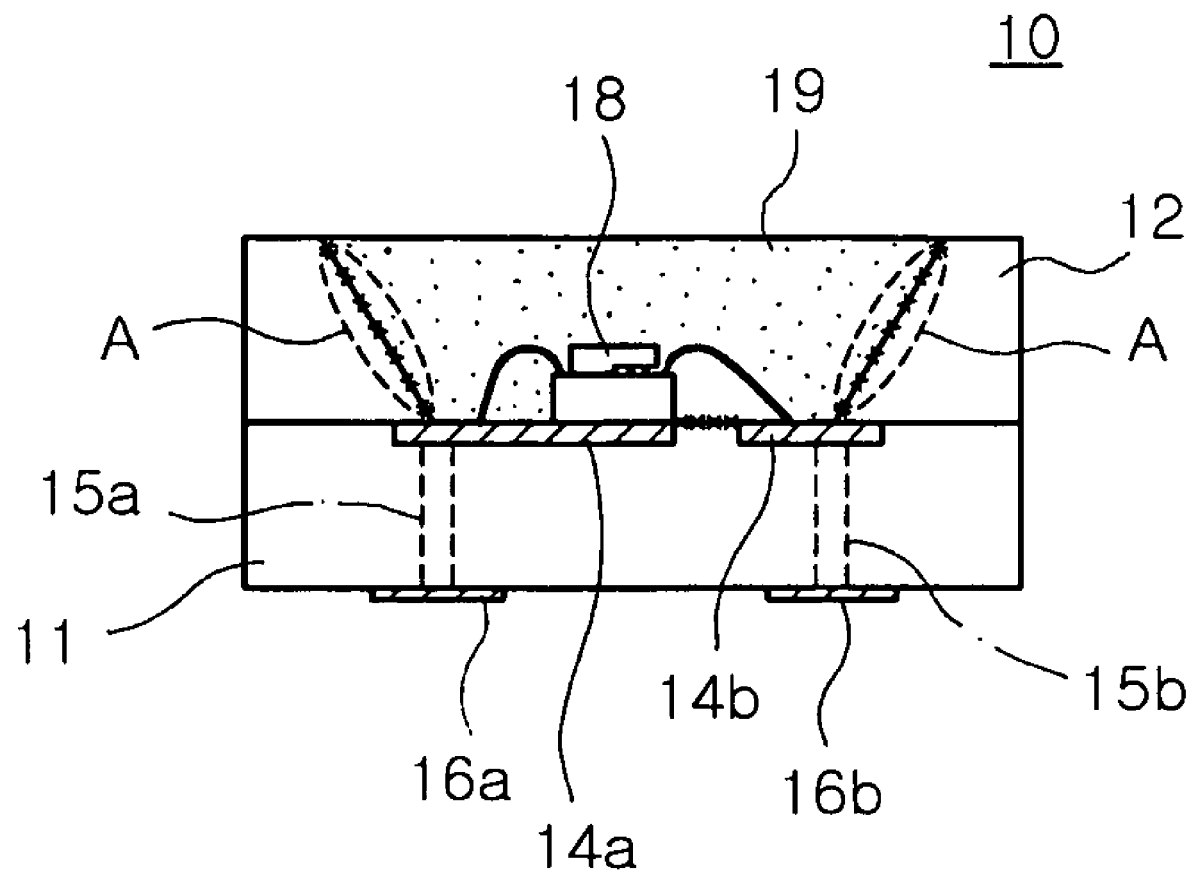
FIG. 1 is a vertical cross-sectional view illustrating a general light emitting diode (LED) package structure.

As shown in FIG. 4(a), a wafer 41 for the lower substrate has metal patterns formed on a mounting area 41a in each individual package unit. The metal patterns are illustrated as lead frames 44a and 44b on an upper surface thereof, but can be understood that vias electrically connecting bonding pads are formed on an undersurface thereof and the lead frames as shown in FIG. 1. The wafer 41 for the lower substrate can be inserted into a reactive chamber shown in FIG. 3 and plasma-treated before it is cut into individual packages. Surface-reforming is required for only the mounting area 41a where the resin-molded part will be formed thereon later, but since the plasma treatment according to the present invention is performed in a degree that does not damage the substrate, it is more advantageous in terms of the process to perform the plasma treatment at wafer level.

As shown in FIG. 4b, plasma treatment can also be performed on a wafer 42 for an upper substrate before it is cut into individual packages. The wafer 42 for the upper substrate has a cavity C defined as a mounting area in each individual package unit, and the cavity C has a side wall 42a that is a sloped surface faced upward to reflect. Therefore, the sloped side wall 42a of the wafer for the upper substrate can be surface-reformed as well during the plasma treatment without being adjusted in its angle.

Figure 4:
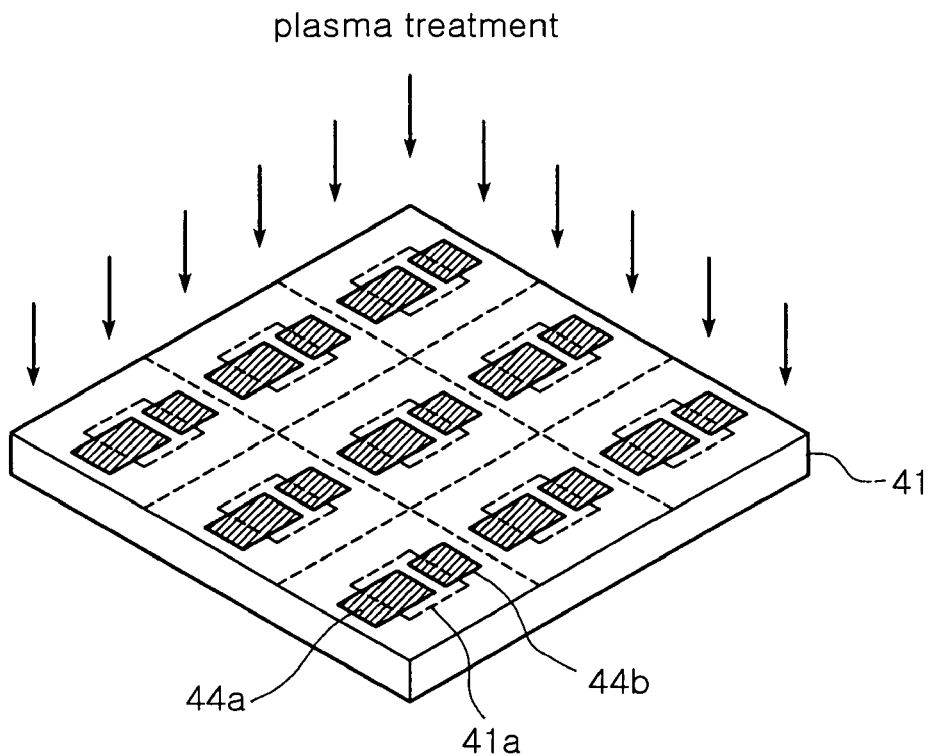
FIG. 4 is a perspective view illustrating an upper substrate and a lower substrate adopted in one embodiment of the present invention.
Figure 4:
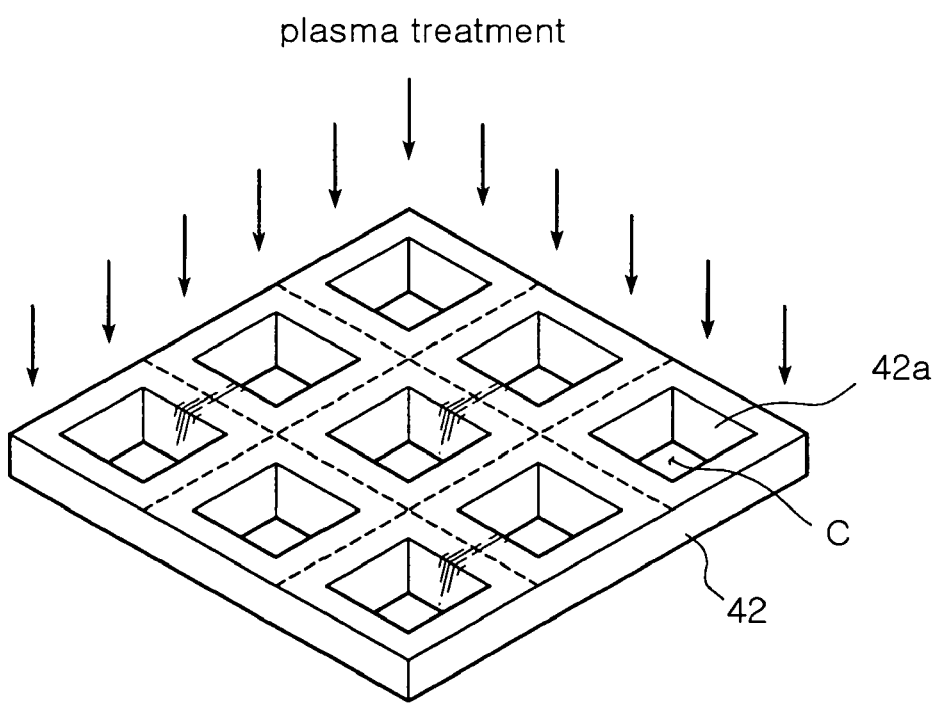
Figure 5:
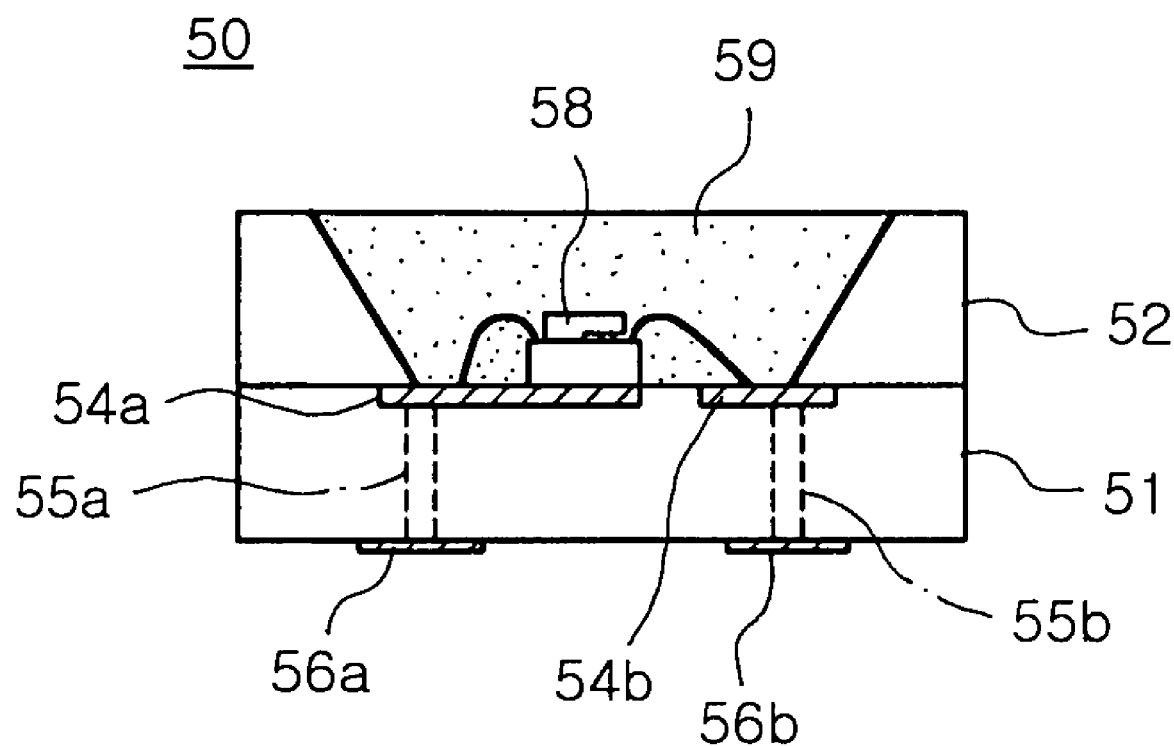
FIG. 5 is a vertical cross-sectional view illustrating an LED package structure according to the present invention adopting the upper substrate and the lower substrate shown in FIG. 4.

FIG. 5 is a vertical cross-sectional view illustrating a structure of the LED package adopting the upper substrate and the lower substrate shown in FIG. 4.

With reference to FIG. 5, the LED package 50 includes the lower substrate 51 with metal patterns formed thereon and the upper substrate 52 with a cavity formed therein. The upper substrate 52 and the lower substrate 51 can be a silicon substrate, respectively. The metal patterns formed on the lower substrate 51 can be composed of lead frames 54a and 54b, bonding pads 56a and 56b, and conductive vias 55a and 55b electrically connecting each of the lead frames 54a and 54b with each of the bonding pads 56a and 56b. The upper substrate 52 has the cavity defining the mounting area of the LED. The side wall of the cavity is a sloped surface facing upward, which can be utilized as a reflective surface.

In addition, as shown in FIGS. 4a and 4b, plasma treatment (or heat treatment) can be performed on the upper substrate 52 and the lower substrate 51 at wafer level to reform the surface of the upper and lower substrates 52 and 51. The surface becomes finely roughened after plasma-treated, having a larger contact area.

The LED 58 is mounted in the mounting area defined by the cavity and electrically connected to the lead frames 54a and 54b. A resin-molded part 59 is formed in the mounting area with the LED 58 mounted therein. The resin-molded part 59 is formed on the reformed substrate surface, and thus has high adhesion strength to the substrate and high thermal stability. Such a resin-molded part 59 may be made of epoxy resin, silicone resin, urethane resin, or a compound thereof, and specific phosphors can be added thereto depending on the needs.

The conditions for plasma and heat treatments adopted in the present invention and attendant effects will be described in detail hereinafter with following examples.

EXAMPLE 1

First, as shown in FIGS. 4(a) and 4(b), the upper substrate and the lower substrate for the LED package were fabricated using silicon wafers and plasma treatment was performed on the substrates. For the reactive gas used in the plasma treatment, $H_2$ and $N_2$ were used at a ratio of 1:1.5. The plasma treatment was performed with vacuum pressure of $10^{-5}$ Torr to $10^{-6}$ Torr, and supply power of 800 W to 1000 W for 2 hours. The temperature of the substrate was maintained at about 100° C.

Next, using the above substrates as shown in FIG. 4, thirty LED packages were fabricated. For the resin-molded part, resin with epoxy and silicone mixed at a ratio of 40 wt %:60 wt % was used.

EXAMPLE 2

In this example, as shown in FIGS. 4(a) and 4(b), the upper and lower substrates were fabricated using silicon wafers, and disposed in a heating furnace to be heat-treated. The heat treatment was performed with the reactive gas of $H_2$ and $N_2$ mixed at a ratio of 1:1.5, at a temperature of 350° C. to 370° C. for about 2 hours.

Next, the substrates were used as shown in FIG. 4 to fabricate thirty LED packages. In the same fashion as in Example 1, resin with epoxy and silicone mixed at a ratio of 40 wt %:60 wt % was used for the resin-molded part.

COMPARATIVE EXAMPLE

In this comparative example, the upper substrate and the lower substrate were fabricated using the silicon wafers as shown in FIGS. 4(a) and 4(b). Thirty LED packages were fabricated as illustrated in FIG. 4(a), but without the heat treatment or the plasma treatment being performed on the substrates. In the same fashion as in Example 1 and Example 2, resin with epoxy and silicone mixed at a ratio of 40 wt %:60 wt % was used for the resin-molded part.

The thirty samples obtained from Example 1, Example 2 and Comparative Example were evaluated in the adhesion strength of the resin-molded part (Table 1), the thermal stress generated at 100° C./min, and the amount of moisture absorption (Table 3) inside the package (Ten packages from each Example were evaluated for each of the above evaluation items).

Table 1 below is the measurement results of the adhesion strength between the resin-molded part and the substrate. As shown in Table 1, superior adhesion strength was exhibited in Examples 1 and 2 compared to Comparative Example. In Example 2 with heat treatment, the adhesion strength was improved about 62% on average compared with Comparative example. Particularly, in Example 1 with plasma treatment, the adhesion strength was improved 171% on average compared with Comparative Example, which is an even more improved result from Example 2 with heat treatment.

TABLE 1

|   | Comparative Example (N/cm$^2$) | Example 1 (N/cm$^2$) | Example 2 (N/cm$^2$) |
| --- | --- | --- | --- |
| 1 | 223 | 620 | 367 |
| 2 | 225 | 618 | 370 |
| 3 | 223 | 622 | 372 |
| 4 | 238 | 619 | 373 |
| 5 | 234 | 623 | 369 |
| 6 | 229 | 623 | 371 |
| 7 | 230 | 618 | 369 |
| 8 | 232 | 620 | 372 |
| 9 | 227 | 621 | 375 |
| 10 | 225 | 618 | 371 |
| Mean | 228.6 | 620.2 | 370.9 |

Table 2 below shows the effect due to the differences in thermal expansion coefficients between the resin-molded part and the substrate. In this experiment, the thermal stress generated at the interface at 100° C./min was measured. As shown in Table 2, Examples 1 and 2 exhibit excellent thermal stability compared with Comparative Example. Example 2 with heat treatment exhibits 21% less thermal stress on average than Comparative Example. Particularly, Example 1 with plasma treatment exhibits 30% less thermal stress on average than Comparative Example, which is an even more improved result from the case of heat treatment.

TABLE 2

|   | Comparative Example(N/cm$^2$) | Example 1 (N/cm$^2$) | Example 2 (N/cm$^2$) |
| --- | --- | --- | --- |
| 1 | 360 | 252 | 285 |
| 2 | 368 | 255 | 280 |
| 3 | 362 | 253 | 282 |
| 4 | 369 | 258 | 283 |
| 5 | 363 | 254 | 289 |
| 6 | 363 | 259 | 281 |
| 7 | 368 | 250 | 289 |
| 8 | 360 | 252 | 282 |
| 9 | 361 | 257 | 285 |
| 10 | 368 | 255 | 281 |
| Mean | 364.2 | 254.5 | 283.7 |

Table 3 below shows the measurement results of the level of adhesion between the resin-molded part and the package substrate. In this experiment, each sample was maintained in an environment of relative humidity of 90%, and 35° C. for 7 days, and the moisture amount was measured in the mounting area of the LED. As shown in Table 3, Examples 1 and 2 show superior levels of adhesion compared with Comparative Example. In Example 2 with heat treatment, the moisture was 0.062 wt % less on average than the Comparative Example. Particularly, in Example 1 with plasma treatment, the moisture was 0.096% less on average than Comparative Example, which is an even more improved result from the case of heat treatment.

TABLE 3

|  | Comparative Example(wt %) | Example 1 (wt %) | Example 2 (wt %) |
|---|---|---|---|
| 1 | 0.13 | 0.04 | 0.08 |
| 2 | 0.11 | 0.05 | 0.09 |
| 3 | 0.14 | 0.06 | 0.08 |
| 4 | 0.15 | 0.05 | 0.09 |
| 5 | 0.17 | 0.04 | 0.08 |
| 6 | 0.14 | 0.05 | 0.10 |
| 7 | 0.15 | 0.06 | 0.09 |
| 8 | 0.16 | 0.07 | 0.08 |
| 9 | 0.18 | 0.07 | 0.10 |
| 10 | 0.17 | 0.05 | 0.09 |
| Mean | 0.150 | 0.054 | 0.088 |

As the results from the experiments indicate, plasma treatment allows significantly improved adhesion strength, thermal stability and level of adhesion. Heat treatment also yields similar effects. To obtain a desired level of effects with the heat treatment, however, it is required that the heat treatment is performed in an inert gas atmosphere, at about 300 to 400° C. for 1 to 3 hours.

As discussed above, according to the present invention, a package substrate such as made of Si is surface-reformed via plasma or heat treatment to obtain a high level of adhesive strength, adhesion and thermal stability between a resin-molded part and the package substrate. Therefore, the invention can be advantageously used to fabricate an LED package having superior reliability.

While the present invention has been shown and described in connection with the preferred embodiments, it will be apparent to those skilled in the art that modifications and variations can be made without departing from the spirit and scope of the invention as defined by the appended claims.

What is claimed is:

1. A method of fabricating a light emitting diode (LED) package comprising steps of:
   providing a package substrate having a mounting area of an LED and a metal pattern to be connected with the LED;
   plasma-treating the package substrate to reform at least a predetermined surface area of the package substrate where a resin-molded part will be formed;
   mounting the LED on the mounting area on the substrate package and electrically connecting the LED with the metal pattern; and
   forming the resin-molded part in the mounting area of the LED to seal the LED package.

2. The method according to claim 1, wherein the package substrate comprises an upper substrate having a cavity with a sloped side wall, formed in an area corresponding to the mounting area of the LED, and a lower substrate having the mounting area of the LED and the metal pattern on an upper surface thereof.

3. The method according to claim 2, wherein the step of plasma-treating is performed on the entire upper and lower substrates, respectively.

4. The method according to claim 3, wherein the step of plasma-treating is performed at wafer level before the package substrate is cut into individual packages.

5. The method according to claim 1, wherein the package substrate is a silicon substrate.

6. The method according to claim 5, wherein the step of plasma-treating is performed in a vacuum-state with inert gas as a reactive gas at an output power of 700 W to 1500 W for 1 to 3 hours.

7. The method according to claim 6, wherein the step of plasma-treating is performed with a silicon substrate kept at a temperature ranging from 80° C. to 120° C.

8. The method according to claim 1, wherein the resin-molded part is made of epoxy resin, silicone resin, urethane resin or a compound thereof.

9. A method of fabricating a light emitting diode (LED) package comprising steps of:
   providing a silicon package substrate having a mounting area of an LED and a metal pattern to be connected with the LED;
   heat-treating the package substrate in an atmosphere of inert gas at a temperature ranging from about 300° C. to 400° C. for 1 to 3 hours in order to reform at least a predetermined surface area of the package substrate where a resin-molded part will be formed;
   mounting the LED on the mounting area of the LED and electrically connecting the LED with the metal pattern; and
   forming the resin-molded part in the mounting area of the LED to seal the LED package.

* * * * *